United States Patent
Chen et al.

(10) Patent No.: US 10,475,755 B2
(45) Date of Patent: Nov. 12, 2019

(54) SEMICONDUCTOR STRUCTURE

(71) Applicant: TAIWAN SEMICONDUCTOR MANUFACTURING COMPANY LTD., Hsinchu (TW)

(72) Inventors: Vincent Chen, Taipei (TW); Hung-Yi Kuo, Taipei (TW); Chuei-Tang Wang, Taichung (TW); Hao-Yi Tsai, Hsinchu (TW); Chen-Hua Yu, Hsinchu (TW); Wei-Ting Chen, Tainan (TW); Ming Hung Tseng, Miaoli County (TW); Yen-Liang Lin, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/173,450

(22) Filed: Oct. 29, 2018

(65) Prior Publication Data
US 2019/0067222 A1 Feb. 28, 2019

Related U.S. Application Data

(60) Continuation of application No. 15/944,463, filed on Apr. 3, 2018, now Pat. No. 10,115,685, which is a division of application No. 14/928,651, filed on Oct. 30, 2015, now Pat. No. 9,953,936.

(51) Int. Cl.
*H01L 23/66* (2006.01)
*H01L 23/10* (2006.01)
*H01L 23/31* (2006.01)

(52) U.S. Cl.
CPC .......... *H01L 23/66* (2013.01); *H01L 23/3107* (2013.01)

(58) Field of Classification Search
CPC .......................... H01L 23/66; H01L 23/3107
See application file for complete search history.

(56) References Cited

U.S. PATENT DOCUMENTS

| | | | | |
|---|---|---|---|---|
| 10,115,685 B2* | 10/2018 | Chen | ............ | H01L 23/66 |
| 2011/0304012 A1* | 12/2011 | Kim | ............ | H01L 21/56 |
| | | | | 257/531 |
| 2015/0280327 A1* | 10/2015 | Spella | ............ | H01Q 19/10 |
| | | | | 342/5 |
| 2017/0278808 A1* | 9/2017 | Liao | ............ | H01L 23/66 |

* cited by examiner

*Primary Examiner* — Seahvosh Nikmanesh
(74) *Attorney, Agent, or Firm* — WPAT, P.C., Intellectual Property Attorneys; Anthony King

(57) ABSTRACT

A method of manufacturing a semiconductor structure includes providing a transceiver, forming a molding to surround the transceiver, forming a plurality of recesses extending through the molding, disposing a conductive material into the plurality of recesses to form a plurality of vias, disposing and patterning an insulating layer over the molding, the plurality of vias and the transceiver, and forming a redistribution layer (RDL) over the insulating layer, wherein the RDL comprises an antenna disposed over the insulating layer and a dielectric layer covering the antenna, and a portion of the antenna is extended through the insulating layer and is electrically connected with the transceiver.

20 Claims, 9 Drawing Sheets

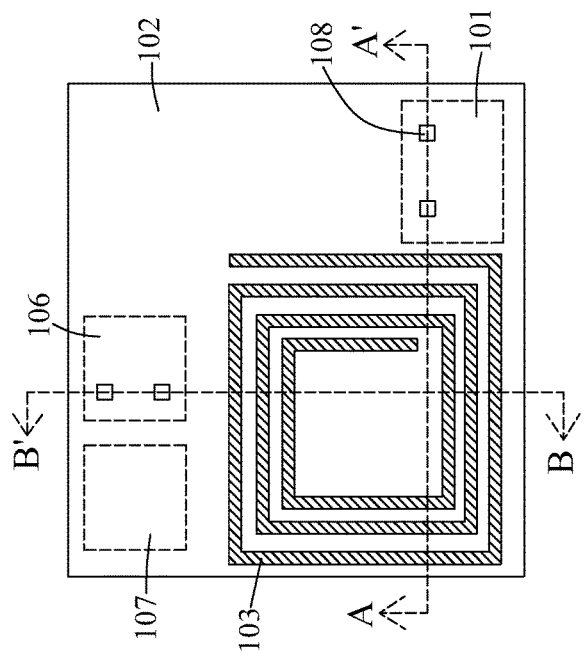
FIG. 4J
FIG. 4K
FIG. 4L

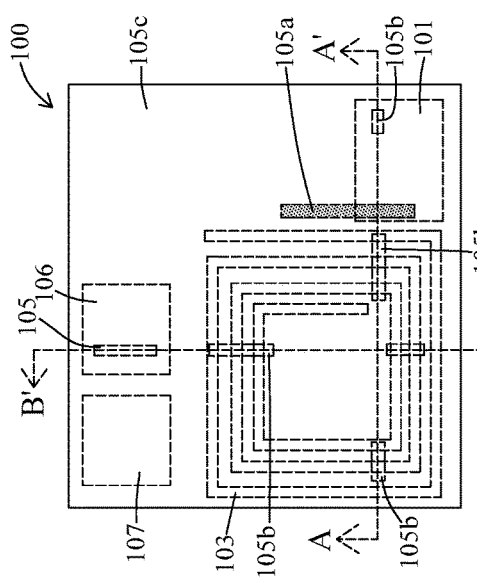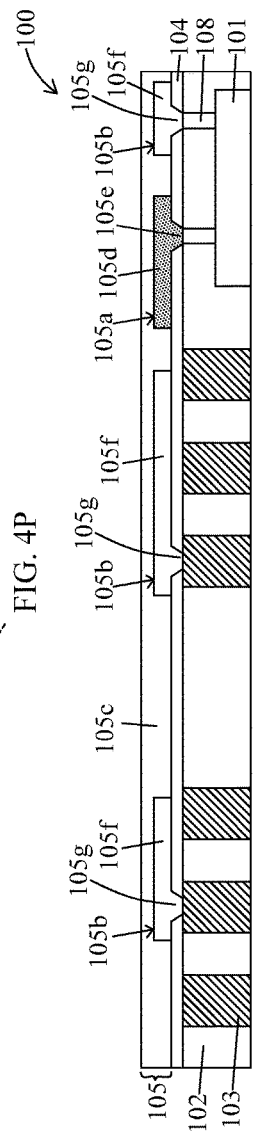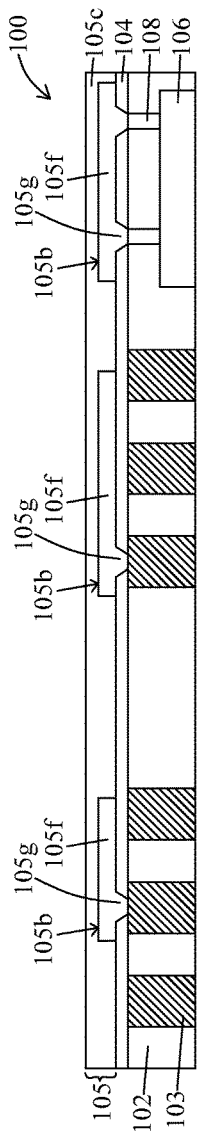
FIG. 4P
FIG. 4Q
FIG. 4R

SEMICONDUCTOR STRUCTURE

CROSS-REFERENCE TO RELATED APPLICATIONS

This application claims priority to U.S. patent application Ser. No. 15/944,463, filed on Apr. 3, 2018, entitled of "METHOD OF MANUFACTURING A SEMICONDUCTOR STRUCTURE", which is a divisional application of U.S. patent application Ser. No. 14/928,651 filed Oct. 30, 2015, which is incorporated herein by reference in its entirety.

BACKGROUND

Electronic equipment involving semiconductor devices are essential for many modern applications. The semiconductor device has experienced rapid growth. Technological advances in materials and design have produced generations of semiconductor devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductor devices.

As technologies evolve, a design of the electronic equipment becomes more complicated and involves great amount of circuitries to perform complex functions. Thus, the electronic equipment increasingly require great amount of power to support and perform such increase amount of functionalities. An increasing number of the electronic equipment such as mobile phone, camera, notebook, etc. are powered by a rechargeable battery. The electronic equipment are often charged or recharged by connecting a terminal on the electronic equipment to a power supply through conductive lines or electrical wires. However, such wire connection approach may be inconvenient to a user, because the electronic equipment has to physically connect to the power supply during charging. Also, the electronic equipment has to be placed near to the power supply due to limitation on a length of the conductive line.

Therefore, there is a continuous need to modify structure and manufacturing method of the semiconductor devices in the electronic equipment in order to bring convenient to user and improve the performance of the electronic equipment while reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4J is a schematic top view of vias and pillars in accordance with some embodiments of the present disclosure.

FIG. 4K is a schematic cross sectional view of FIG. 4J along AA' in accordance with some embodiments of the present disclosure.

FIG. 4L is a schematic cross sectional view of FIG. 4J along BB' in accordance with some embodiments of the present disclosure.

FIG. 4P is a schematic top view of a redistribution layer (RDL) in accordance with some embodiments of the present disclosure.

FIG. 4Q is a schematic cross sectional view of FIG. 4P along AA' in accordance with some embodiments of the present disclosure.

FIG. 4R is a schematic cross sectional view of FIG. 4P along BB' in accordance with some embodiments of the present disclosure.

DETAILED DESCRIPTION OF THE DISCLOSURE

Figure 1:
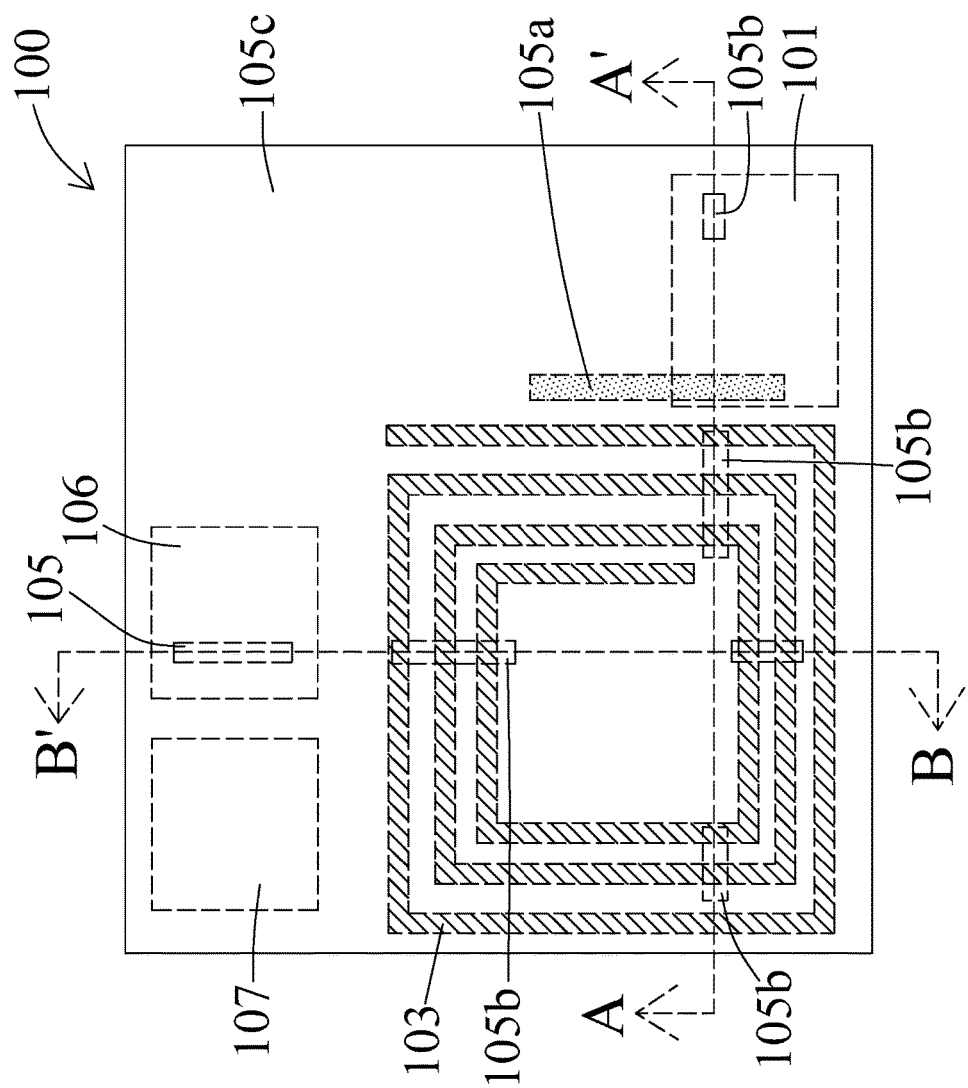
FIG. 1 is a schematic top view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Wireless charging is a technology of charging or recharging an electronic equipment through an air. A power transmission between a transmitter (e.g. in a charger) and a receiver (e.g. in an electronic equipment) over the air is involved. The transmitter and the receiver include an antenna respectively, and a power is transmitted from the antenna in the transmitter and received by the antenna in the receiver. The antenna is often an individual component, that a conductive wire is required to interconnect the antenna with the transmitter or the receiver. Such interconnection however would result in a line loss and thus affect a performance of the power transmission. Furthermore, there is a demand for small size of the antenna, since the transmitter or the receiver is getting smaller and smaller in geometric size. The antenna has to be miniaturized to meet such demand without compromise a performance and efficiency of the power transmission.

The present disclosure is directed to a semiconductor structure including a redistribution layer (RDL) integrated with an antenna. The antenna is disposed in the RDL and configured to wirelessly communicate with a transmitter which transmits a charging power to the semiconductor structure for charging an electronic equipment. Such integration of the antenna into the RDL would minimize a path loss and thus maximize a transfer coverage, that a signal propagated from the antenna can reach a further distance. Further, a signal from the transmitter disposed in a further distance can be received by the antenna. Other embodiments are also disclosed.

Figure 2:
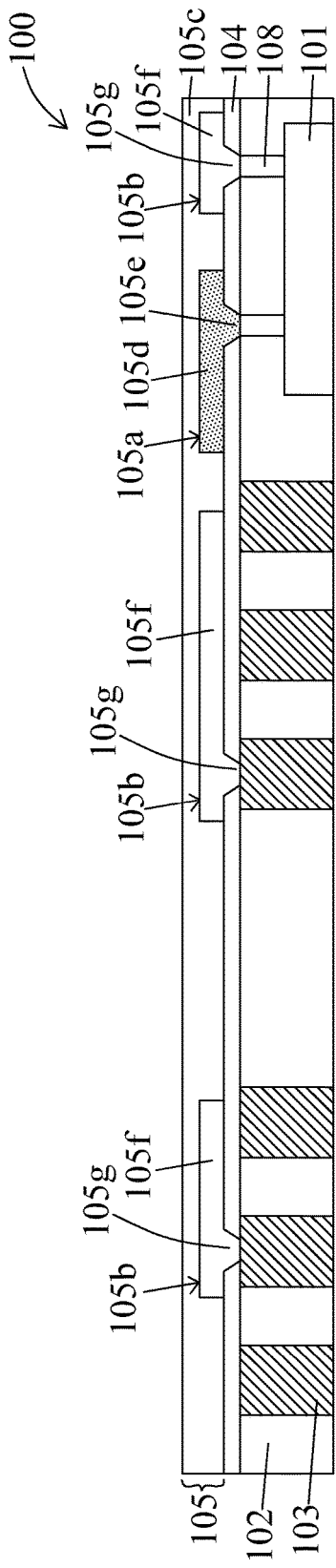
FIG. 2 is a schematic cross-sectional view of a semiconductor structure along A-A' of FIG. 1 in accordance with some embodiments of the present disclosure.
Figure 3:
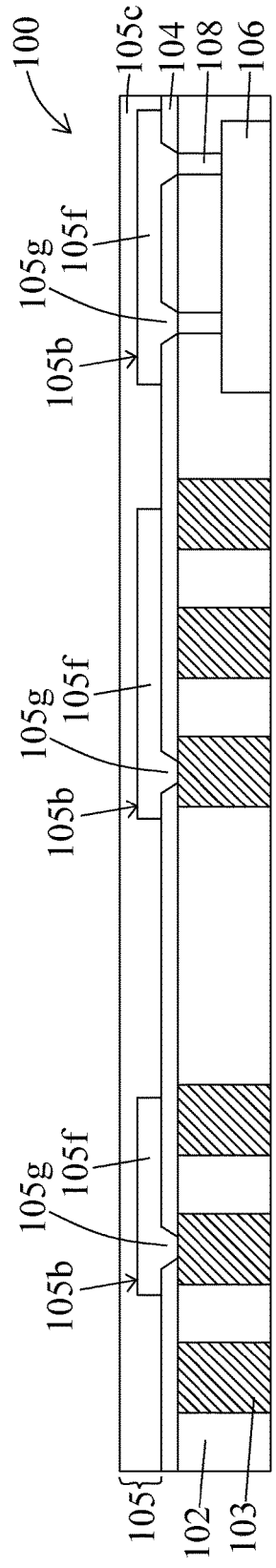
FIG. 3 is a schematic cross-sectional view of a semiconductor structure along B-B' of FIG. 1 in accordance with some embodiments of the present disclosure.

FIG. 1 illustrates a schematic top view of a semiconductor structure 100 in accordance with some embodiments of the present disclosure. FIG. 2 illustrates a schematic cross sectional view of the semiconductor structure 100 along AA' of FIG. 1. FIG. 3 illustrates a schematic cross sectional view of the semiconductor structure 100 along BB' of FIG. 1. In some embodiments, the semiconductor structure 100 includes a transceiver 101, a molding 102, a via 103, a redistribution layer (RDL) 105 and a charger 106.

In some embodiments, the semiconductor structure 100 is electrically connected to a power supply. In some embodiments, the semiconductor structure 100 is configured to receive a charging power in electromagnetic energy across an air or intervening space. In some embodiments, the semiconductor structure 100 is a receiver. In some embodiments, a charging power is transmitted from a remote transmitter disposed away from the semiconductor structure 100 and within the predetermined distance, and the charging power is received by the semiconductor structure 100 for charging or recharging electronic equipment (e.g. mobile phone, notebook, etc.). In some embodiments, the charging power can be wirelessly transmitted from the remote transmitter to the semiconductor structure 100. In some embodiments, the semiconductor structure 100 can convert the charging power from the remote transmitter in electromagnetic energy to electrical energy. The electrical energy is utilized for charging or recharging the electronic equipment. In some embodiments, the semiconductor structure 100 converts the charging power from the remote transmitter in alternating current (AC) to direct current (DC) for charging or recharging the electronic equipment.

In some embodiments, the transceiver 101 in the semiconductor structure 100 is configured to communicate with a device such as the remote transmitter or the like. In some embodiments, the transceiver 101 is configured to transmit a signal to the remote transmitter or receive a signal from the remote transmitter. In some embodiments, the transceiver 101 receives a signal in the predetermined electromagnetic energy from the remote transmitter when the transmitter is disposed adjacent to the semiconductor structure 100 or within the predetermined distance. In some embodiments, the transceiver 101 is a semiconductor chip including a variety of electrical circuits for performing various functions. In some embodiments, the transceiver 101 is disposed at a corner of the semiconductor structure 100.

In some embodiments, the transceiver 101 can emit a signal and the remote transmitter can receive the signal in electromagnetic radiation from the transceiver 101, and the remote transmitter can emit a signal in electromagnetic radiation and the transceiver 101 can receive the signal from the remote transmitter, such that the semiconductor structure 100 can wirelessly communicate with the remote transmitter through the transceiver 101. In some embodiments, the transceiver 101 can transmit or receive a signal in a predetermined electromagnetic frequency. In some embodiments, the transceiver 101 can transmit or receive a signal in the predetermined electromagnetic frequency of about 2.4 GHz. In some embodiments, the transceiver 101 can transmit or receive a signal in an electromagnetic radiation of Bluetooth low energy (BLE). The transceiver 101 can communicate with the remote transmitter via the BLE. In some embodiments, the semiconductor structure 100 wirelessly receives a charging power from the remote transmitter for charging or recharging the electronic equipment after a signal in the predetermined electromagnetic frequency from the remote transmitter is received by the transceiver 101. The charging or recharging of the electronic equipment is initiated when the transceiver 101 is wirelessly communicated with the remote transmitter.

In some embodiments, the semiconductor structure 100 includes the molding 102 which surrounds the transceiver 101. In some embodiments, the molding 102 is disposed over the transceiver 101. In some embodiments, the molding 102 is a single layer film or a composite stack. In some embodiments, the molding 102 is a compound and formed with composite materials such as rubber, polymer, epoxy, resin, polyimide, polybenzoxazole (PBO), etc. The molding 102 has a high thermal conductivity, a low moisture absorption rate, a high flexural strength at board-mounting temperatures, or a combination of these. In some embodiments, the molding 102 has a thickness of about 100 μm to about 200 μm.

In some embodiments, the semiconductor structure 100 includes the via 103 extending through the molding 102. In some embodiments, the via 103 is surrounded by the molding 102. In some embodiments, the via 103 is disposed at a central portion of the semiconductor structure 100. In some embodiments, the via 103 is extended along a length or a width of the molding 102. In some embodiments, the via 103 is a through integrated circuit via (TIV). In some embodiments, the via 103 is an antenna coil configured to receive the charging power from the remote transmitter for charging or recharging the electronic equipment. In some embodiments, the via 103 has a working frequency of about 6.78 MHz. In some embodiments, the via 103 includes conductive material such as gold, silver, copper, nickel, tungsten, aluminum, tin and/or alloys thereof. In some embodiments, the via 103 is in a spiral or loop configuration. In some embodiments, a cross section of the via 103 is in a rectangular, circular or polygonal shape. In some embodiments, the via 103 is in a strip shape.

In some embodiments, the via 103 is configured to surround a dummy structure. In some embodiments, the dummy structure is disposed at a central portion of the semiconductor structure 100. In some embodiments, the via 103 is configured to inductively coupled with a conductive structure. In some embodiments, the via 103 is configured to electrically connected with a resonator 107. In some embodiments, the via 103 is configured to generate an electric current induced by a magnetic field. In some embodiments, the via 103 has a depth of about 100 μm to about 200 μm. In some embodiments, the depth of the via 103 is about 150 μm.

In some embodiments, a pillar 108 is disposed over the transceiver 101 and surrounded by the molding 102. In some embodiments, the pillar 108 is extended through the molding 102 towards the transceiver 101. In some embodiments, the pillar 108 is configured to electrically connect the transceiver 101 with an interconnect structure. In some embodiments, the pillar 108 includes conductive material such as copper, silver, tungsten, gold, platinum, titanium, nickel, aluminum, etc.

In some embodiments, an insulating layer 104 is disposed over the molding 102, the via 103 and the transceiver 101. In some embodiments, the insulating layer 104 includes polymer, polyimide, polybenzoxazole (PBO), etc. In some embodiments, the insulating layer 104 has a thickness of about 3 μm to about 5 μm. In some embodiments, the thickness of the insulating layer 104 is about 4.5 μm.

In some embodiments, the semiconductor structure 100 includes the RDL 105 disposed over the transceiver 101, the molding 102 and the via 103. In some embodiments, the RDL 105 is disposed over the insulating layer 104. In some embodiments, the RDL 105 includes an antenna 105a, an interconnect structure 105b and a dielectric layer 105c. In some embodiments, the antenna 105a is disposed over the insulating layer 104 and electrically connected with the transceiver 101. In some embodiment, a portion of the antenna 105a is extended through the insulating layer 104 and the molding 102 to electrically connect with the transceiver 101. In some embodiments, another portion of the antenna 105a is extended over the insulating layer 104 along the length or the width of the semiconductor structure 100.

In some embodiments, the transceiver 101 can wirelessly transmit a signal to the remote transmitter or receive a signal from the remote transmitter via the antenna 105a. The transceiver 101 can communicate with the remote transmitter via the antenna 105a. In some embodiments, the antenna 105a is configured to transmit a signal in electromagnetic radiation from the transceiver 101 to surrounding or ambient environment. In some embodiments, the antenna 105a can transmit or receive a signal in the predetermined electromagnetic frequency of about 2.4 GHz. In some embodiments, the antenna 105a can transmit or receive a signal in an electromagnetic radiation of Bluetooth low energy (BLE). In some embodiments, the semiconductor structure 100 wirelessly receives a charging power from the remote transmitter for charging or recharging the electronic equipment after a signal in the predetermined electromagnetic frequency from the remote transmitter is received by the antenna 105a. The charging or recharging of the electronic equipment is initiated when the transceiver 101 is wirelessly communicated with the remote transmitter via the antenna 105a.

In some embodiments, the antenna 105a can transmit a signal reaching a distance of greater than about 8 meters. In some embodiments, the signal transmitted from the antenna 105a can reach the distance of about 10 meters. In some embodiments, the antenna 105a is configured to receive a signal from the remote transmitter disposed in a distance of greater than about 8 meters. In some embodiments, the antenna 105a can receive a signal from the remote transmitter disposed in the distance of about 10 meters. In some embodiments, the antenna 105a has a length of about 200 μm and a width of about 10 μm. In some embodiments, the antenna 105a is in a strip shape. In some embodiments, the antenna 105a is a Bluetooth antenna. In some embodiments, the antenna 105a includes conductive material such as cooper, titanium, tungsten, etc.

In some embodiments, the antenna 105a includes an elongated portion 105d extending over the molding 102 and a via portion 105e extending through the molding 102 to electrically connect with the transceiver 101. In some embodiments, the elongated portion 105d is extended over the insulating layer 104. In some embodiments, the via portion 105e is extended between the elongated portion 105d and the transceiver 101.

In some embodiments, the antenna 105a has a resonance frequency of about 2.4 GHz. In some embodiments, the antenna 105a can receive a signal in the predetermined electromagnetic frequency corresponding to the resonance frequency of the antenna 105a. In some embodiments, the antenna 105a is configured to inductively coupled with the via 103.

In some embodiments, the interconnect structure 105b includes an elongated portion 105f extending over the molding 102 and the insulating layer 104, and a via portion 105g extending through the insulating layer 104 to the via 103. In some embodiments, the interconnect structure 105b is electrically connected with the via 103. In some embodiments, the interconnect structure 105b is electrically connected with the transceiver 101 through the pillar 108. In some embodiments, the interconnect structure 105b includes conductive material such as cooper, titanium, tungsten, etc.

In some embodiments, the dielectric layer 105c is disposed over the insulating layer 104, the via 103, the molding 102 and the transceiver 101. In some embodiments, the dielectric layer 105c surrounds and covers the antenna 105a and the interconnect structure 105b. In some embodiments, the dielectric layer 105c includes dielectric material such as oxide, silicon oxide, silicon nitride, etc.

In some embodiments, the semiconductor structure 100 includes a charger 106 and a resonator 107. In some embodiments, the resonator 107 is electrically connected with the via 103 and the charger 106. In some embodiments, the charger 106 is configured to convert the charging power received by the via 103 from AC to DC. In some embodiments, the charger 106 is surrounded and covered by the molding 102.

In some embodiments, the resonator 107 configured to oscillate and generate the signal. In some embodiments, the resonator 107 is configured to generate the signal to the charger 106. In some embodiments, the resonator 107 is surrounded and covered by the molding 102. In some embodiments, the resonator 107 is electrically connected to the via 103. In some embodiments, the resonator 107 generates a signal to the charger 106 when the charging power from the remote transmitter in the predetermined electromagnetic frequency is received by the antenna 105a. In some embodiments, the resonator 107 has a resonance frequency substantially different from the resonance frequency of the antenna 105a.

In the present disclosure, a method of manufacturing a semiconductor structure is also disclosed. In some embodiments, a semiconductor structure is formed by a method 400. The method 400 includes a number of operations and the description and illustration are not deemed as a limitation as the sequence of the operations.

Figure 4:
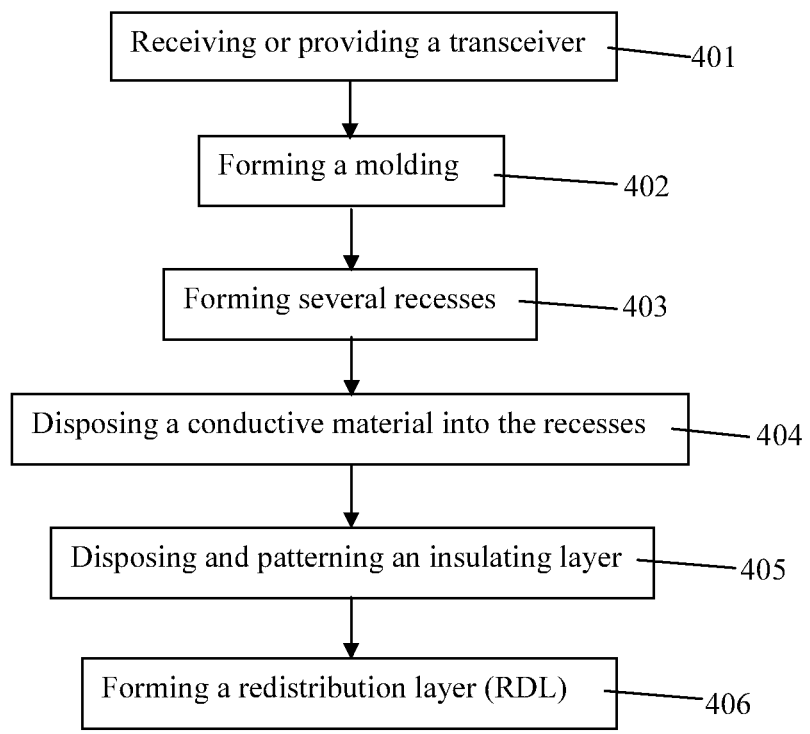
FIG. 4 is a flow diagram of a method of manufacturing a semiconductor structure in accordance with some embodiments of the present disclosure.

FIG. 4 is an embodiment of a method 400 of manufacturing a semiconductor structure 100. The method 400 includes a number of operations (401, 402, 403, 404, 405 and 406).

Figure 4A:
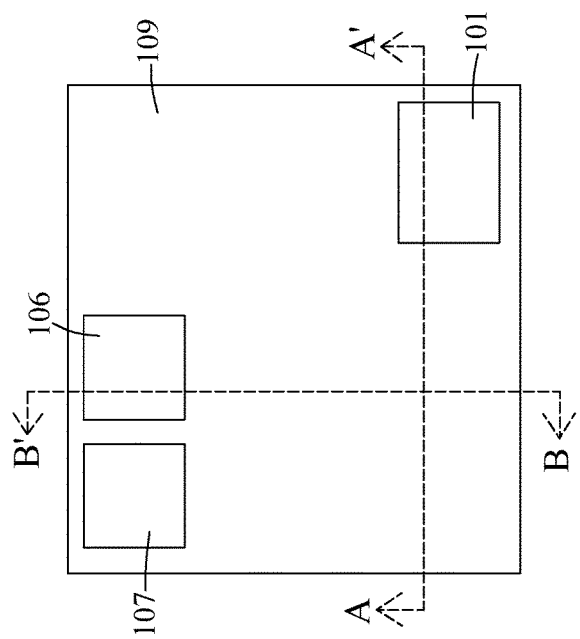
FIG. 4A is a schematic top view of a substrate with a transceiver, charger and resonator in accordance with some embodiments of the present disclosure.
Figure 4B:
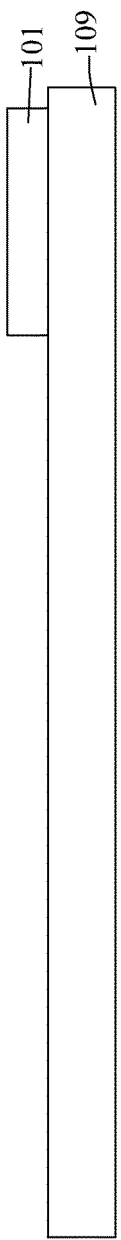
FIG. 4B is a schematic cross sectional view of FIG. 4A along AA' in accordance with some embodiments of the present disclosure.
Figure 4C:
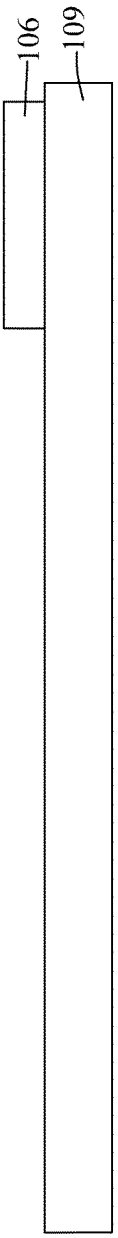
FIG. 4C is a schematic cross sectional view of FIG. 4A along BB' in accordance with some embodiments of the present disclosure.

In operation 401, a transceiver 101 is provided or received as shown in FIGS. 4A-4C. FIG. 4B is a cross sectional view along AA' of FIG. 4A, and FIG. 4C is a cross sectional view along BB' of FIG. 4A. In some embodiments, the transceiver 101 is provided and disposed over a substrate 109. In some embodiments, the substrate 109 is configured to support the transceiver 101. In some embodiments, the transceiver 101 is temporarily attached to the substrate 109. The substrate 109 would be removed upon later operation. In some embodiments, the substrate 109 is a wafer or a carrier. In some embodiments, the substrate 109 includes silicon, ceramic, glass, etc.

In some embodiments, the transceiver 101 is a die or chip which includes semiconductive material. In some embodiments, the transceiver 101 is configured to transmit or receive a signal in a predetermined electromagnetic frequency. In some embodiments, the transceiver 101 can transmit or receive a signal in an electromagnetic radiation of Bluetooth low energy (BLE). In some embodiments, the transceiver 101 can transmit or receive a signal in the predetermined electromagnetic frequency of about 2.4 GHz. In some embodiments, the transceiver 101 is disposed at a corner of the substrate 109. In some embodiments, the transceiver 101 is configured to provide a wireless communication with a remote transmitter In some embodiments, a charger 106 and a resonator 107 are also provided or received. In some embodiments, the charger 106 and the resonator 107 are disposed over the substrate 109. In some embodiments, the charger 106 and the resonator 107 are disposed adjacent to a corner or an edge of the substrate 109. In some embodiments, the charger 106 and the resonator 107 are temporarily attached to the substrate 109, that the substrate 109 would be removed upon later operation. In some embodiments, the resonator 107 is electrically connected with the charger 106. In some embodiments, the charger 106 is configured to convert a charging power from the remote transmitter in AC to DC. In some embodiments, the resonator 107 configured to oscillate and generate the signal. In some embodiments, the resonator 107 is configured to generate the signal to the charger 106.

Figure 4D:
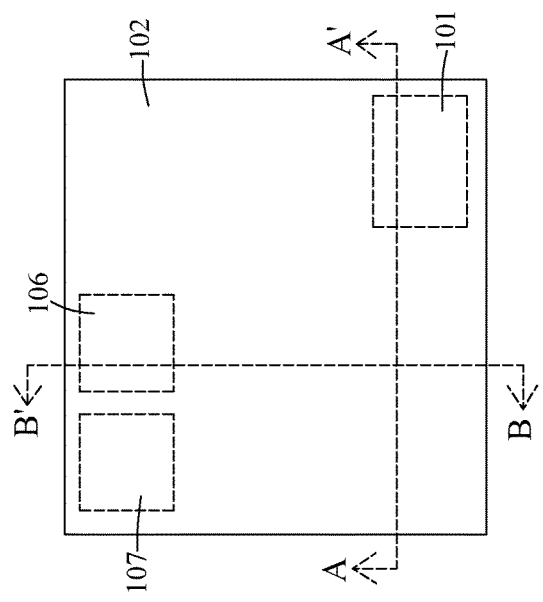
FIG. 4D is a schematic top view of a substrate with a molding in accordance with some embodiments of the present disclosure.
Figure 4E:
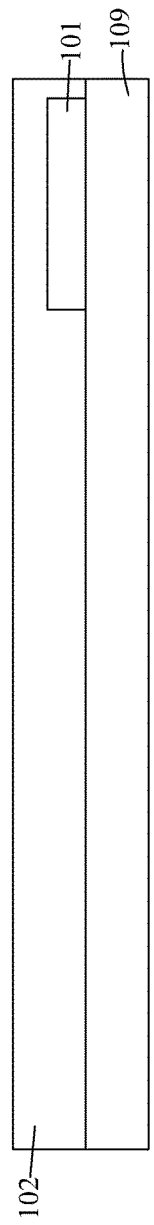
FIG. 4E is a schematic cross sectional view of FIG. 4D along AA' in accordance with some embodiments of the present disclosure.
Figure 4F:
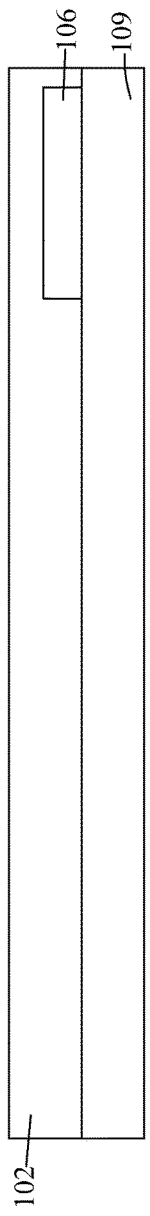
FIG. 4F is a schematic cross sectional view of FIG. 4D along BB' in accordance with some embodiments of the present disclosure.

In operation 402, a molding 102 is formed as shown in FIGS. 4D-4F. FIG. 4E is a cross sectional view along AA' of FIG. 4D, and FIG. 4F is a cross sectional view along BB' of FIG. 4D. In some embodiments, the molding 102 is disposed over the substrate 109. In some embodiments, the molding 102 surrounds and covers the transceiver 101, the charger 106 and the resonator 107. In some embodiments, the molding 102 is a compound and formed with composite materials such as rubber, polymer, epoxy, resin, polyimide, polybenzoxazole (PBO), etc. In some embodiments, the molding 102 is formed by any suitable operation such as compression molding, etc.

Figure 4G:
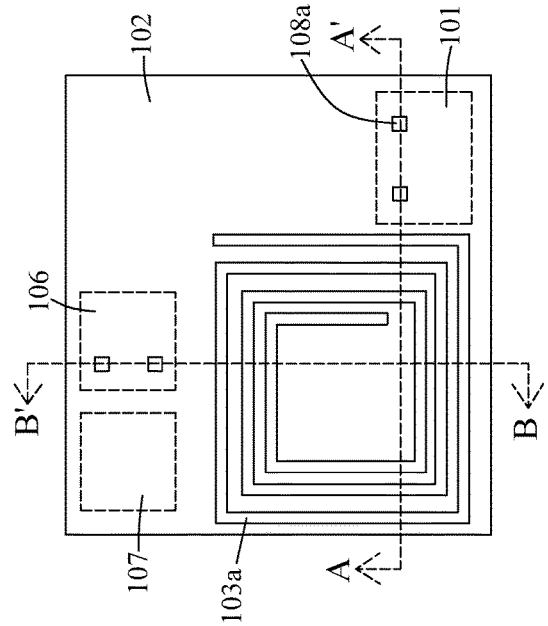
FIG. 4G is a schematic top view of recesses in accordance with some embodiments of the present disclosure.
Figure 4H:
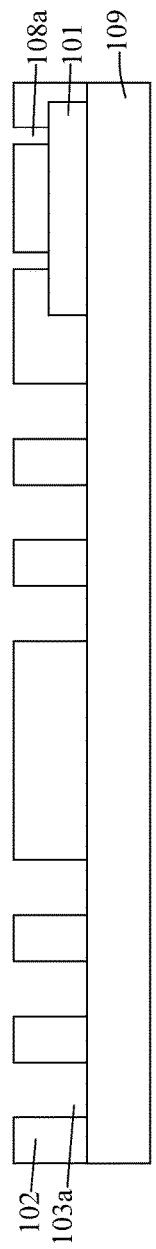
FIG. 4H is a schematic cross sectional view of FIG. 4G along AA' in accordance with some embodiments of the present disclosure.
Figure 4I:
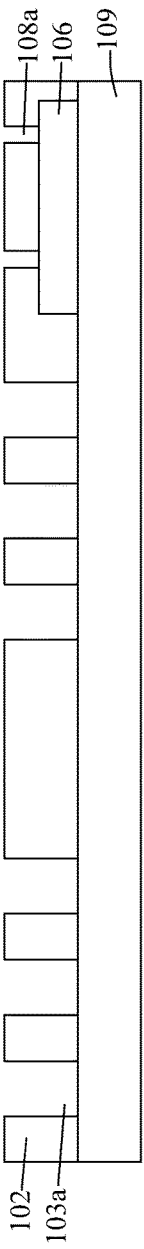
FIG. 4I is a schematic cross sectional view of FIG. 4G along BB' in accordance with some embodiments of the present disclosure.

In operation 403, several recesses (103a or 108a) are formed as shown in FIGS. 4G-4I. FIG. 4H is a cross sectional view along AA' of FIG. 4G, and FIG. 4I is a cross sectional view along BB' of FIG. 4G. In some embodiments, the recesses (103a or 108a) are extended over the substrate 109. In some embodiments, each of the recesses 103a is extended through the molding 102. In some embodiments, each of the recesses 108a is extended from the molding 102 towards the transceiver 101 or the charger 106. The recesses 108a are disposed over the transceiver 101 or the charger 106. In some embodiments, the recesses (103a or 108a) are formed by any suitable operations such as photolithography, etching, etc.

In operation 404, a conductive material is disposed into the recesses (103a or 108a) as shown in FIGS. 4J-4L. FIG. 4K is a cross sectional view along AA' of FIG. 4J, and FIG. 4L is a cross sectional view along BB' of FIG. 4J. In some embodiments, the conductive material is filled with the recesses (103a or 108a). In some embodiments, the conductive material filling the recesses 103a is same or different from the conductive material filling the recesses 108a. In some embodiments, the conductive material includes gold, silver, copper, nickel, tungsten, aluminum, tin and/or alloys thereof. In some embodiments, the conductive material is disposed by any suitable operation such as sputtering, electroplating, deposition, etc.

In some embodiments, several vias 103 are formed after filing the conductive material into the recesses 103a. In some embodiments, several pillars 108 are formed after filing the conductive material into the recesses 108a. In some embodiments, the vias 103 and the pillars 108 are surrounded by the molding 102. In some embodiments, the via 103 is extended through the molding 102. In some embodiments, the pillar 108 is extended from the molding 102 towards the transceiver 101 or the charger 106. In some embodiments, the substrate 109 is removed after forming the vias 103 or the pillars 108.

Figure 4M:
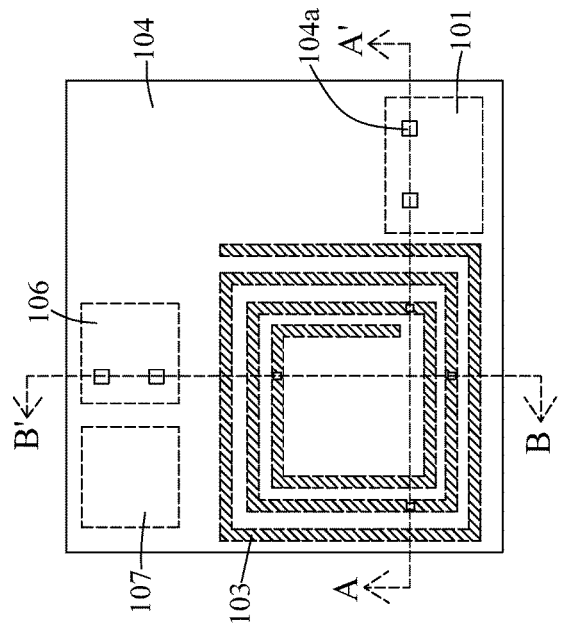
FIG. 4M is a schematic top view of an insulating layer in accordance with some embodiments of the present disclosure.
Figure 4N:
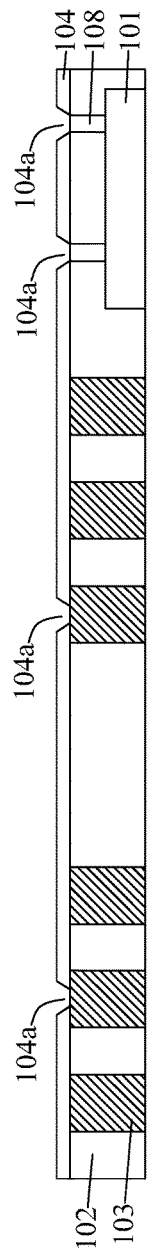
FIG. 4N is a schematic cross sectional view of FIG. 4M along AA' in accordance with some embodiments of the present disclosure.
Figure 4O:
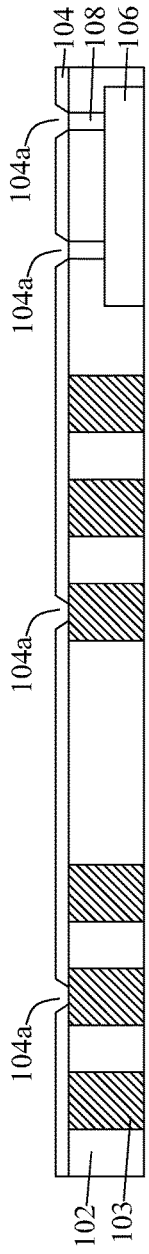
FIG. 4O is a schematic cross sectional view of FIG. 4M along BB' in accordance with some embodiments of the present disclosure.

In operation 405, an insulating layer 104 is disposed and patterned as shown in FIGS. 4M-4O. FIG. 4N is a cross sectional view along AA' of FIG. 4M, and FIG. 4O is a cross sectional view along BB' of FIG. 4M. In some embodiments, the insulating layer 104 is disposed over the molding 102, the vias 103, the pillars 108, the transceiver 101, the charger 106 and the resonator 107. In some embodiments, the insulating layer 104 includes polymer, polyimide, polybenzoxazole (PBO), etc. In some embodiments, the insulating layer 104 is disposed by any suitable operation such as chemical vapor deposition (CVD), etc.

In some embodiments, the insulating layer 104 is patterned by forming several passages 104a extending though the insulating layer 104. In some embodiments, the passage 104a exposes a portion of the via 103 or the pillar 108. In some embodiments, the passage 104a is formed by removing a portion of the insulating layer 104 over the via 103 or the pillar 108. In some embodiments, the portion of the insulating layer 104 is removed by any suitable operation such as photolithography, etching, etc.

In operation 406, a redistribution layer (RDL) 105 is formed as shown in FIGS. 4P-4R. FIG. 4Q is a cross sectional view along AA' of FIG. 4P, and FIG. 4R is a cross sectional view along BB' of FIG. 4P. In some embodiments, a semiconductor structure 100 as shown in FIGS. 4P-4R is formed which has similar configuration as the semiconductor structure 100 described above or illustrated in FIGS. 1-3. In some embodiments, the semiconductor structure 100 is a receiver for receiving the charging power from the remote transmitter disposed within a predetermined distance and charging or recharging an electronic equipment.

In some embodiments, the RDL 105 is formed over the insulating layer 104. In some embodiments, the RDL 105 includes an antenna 105a disposed over the insulating layer 104 and a dielectric layer 105c covering the antenna 105a. In some embodiments, the antenna 105a is disposed over the insulating layer 104 and electrically connected with the transceiver 101 through the passage 104a. In some embodiments, the antenna 105a is disposed by any suitable operations such as electroplating, etc. In some embodiments, a portion of the antenna 105a is extended through the insulating layer 104 and the molding 102 to electrically connect with the transceiver 101. In some embodiments, the antenna 105a includes conductive material such as cooper, titanium, tungsten, etc. In some embodiments, the antenna 105a is in a strip shape. In some embodiments, the antenna 105a is a Bluetooth antenna.

In some embodiments, the antenna 105a includes an elongated portion 105d extending over the insulating layer 104 and a via portion 105e extending through the insulating layer 104 along the passage 104a to electrically connect with the transceiver 101. In some embodiments, the via portion 105e is extended between the elongated portion 105d and the transceiver 101. In some embodiments, the antenna 105a is electrically connected with the transceiver 101 by the pillar 108. The pillar 108 is extended from the insulating layer 104 to the transceiver 101.

In some embodiments, the antenna 105a can wirelessly transmit a signal to the remote transmitter or receive a signal from the remote transmitter. In some embodiments, the antenna 105a can transmit a signal in a predetermined electromagnetic frequency such as Bluetooth low energy (BLE), about 2.4 GHz, etc. In some embodiments, the antenna 105a can transmit a signal reaching a distance of greater than about 8 meters. In some embodiments, the antenna 105a is configured to receive a signal from the remote transmitter disposed in a distance of greater than about 8 meters.

In some embodiments, the RDL 105 includes an interconnect structure 105b disposed over the insulating layer 104. In some embodiments, the interconnect structure 105b includes an elongated portion 105f extending over the insulating layer 104, and a via portion 105g extending through the insulating layer 104 to the via 103 or the pillar 108. In some embodiments, the interconnect structure 105b is electrically connected with the via 103 or the pillar 108. In some embodiments, the interconnect structure 105b is electrically connected with the transceiver 101 or the charger 106 through the pillar 108. In some embodiments, the interconnect structure 105b includes conductive material such as cooper, titanium, tungsten, etc. In some embodiments, the interconnect structure 105b is formed by any suitable operations such as electroplating, etc.

In some embodiments, the dielectric layer 105c is disposed over the insulating layer 104 and covers the antenna 105a and the interconnect structure 105b. In some embodiments, the dielectric layer 105c includes dielectric material such as oxide, silicon oxide, silicon nitride, etc. In some embodiments, the dielectric layer 105c is disposed by any suitable operations such as CVD, etc.

In the present disclosure, an improved semiconductor structure is disclosed. The semiconductor structure includes an antenna disposed therein. The antenna is disposed in the RDL and covered by a dielectric layer. The integration of the antenna into the RDL would minimize a path loss. As a result, a charging power transmitted from the antenna can cover a further distance. Therefore, a performance of wireless charging or recharging an electronic equipment by the semiconductor structure is improved.

In some embodiments, a semiconductor structure is provided. The semiconductor structure includes a charger configured to convert a charging power from AC to DC, a transceiver configured to transmit or receive a signal in a predetermined electromagnetic frequency, a molding surrounding the transceiver and the charger, a plurality of vias extending through the molding, an antenna configured to transmit or receive the signal to/from an ambient environment, and a dielectric layer covering the antenna. In some embodiments, the antenna includes an elongated portion extending over the molding and a via portion electrically connected to the transceiver.

In some embodiments, the antenna is configured to receive a signal in the predetermined electromagnetic frequency from a transmitter, and the plurality of vias is configured to receive the charging power from the transmitter. In some embodiments, each of the plurality of vias is a through integrated circuit via (TIV) extending through the molding and inductively coupled with the antenna. In some embodiments, the antenna has a resonance frequency of about 2.4 GhZ. In some embodiments, the antenna is a Bluetooth antenna. In some embodiments, the molding has a thickness of about 100 µm and 200 µm. In some embodiments, the semiconductor structure further includes pillar electrically connecting the via portion of the antenna and the transceiver. In some embodiments, the semiconductor structure further includes an insulating layer disposed over the molding, the plurality of vias and the pillar. In some embodiments, the via portion of the antenna extends through the insulating layer to contact the pillar. In some embodiments, the pillar and the antenna include a same material.

In some embodiments, a semiconductor structure is provided. The semiconductor structure includes a transceiver, a molding surrounding the transceiver, a plurality of vias extending through the molding, and a redistribution layer (RDL) disposed over the transceiver and the plurality of vias. In some embodiments, the RDL include an antenna disposed over and electrically connected to the transceiver, and a dielectric layer surrounding the antenna. In some embodiments, the antenna includes an elongated portion extending over the molding and a via portion electrically connected to the transceiver.

In some embodiments, the semiconductor structure further includes a pillar disposed between the antenna and the transceiver and surrounded by the molding. In some embodiments, a height of the plurality of vias is greater than a height of the pillar. In some embodiments, the semiconductor structure further includes an insulating layer disposed over the molding, the plurality of vias and the pillar. In some embodiments, the via portion of the antenna extends through the insulating layer to contact the pillar and electrically connect to the transceiver through the pillar.

In some embodiments, a semiconductor structure is provided. The semiconductor structure includes a charger, a transceiver, a molding surrounding the transceiver and the charger, a plurality of vias extending through the molding, an insulating layer disposed over the molding, the charger, the transceiver and the plurality of vias, and a RDL disposed over the insulating layer. In some embodiments, the RDL includes antenna disposed over and electrically connected to the transceiver, a first interconnect structure electrically connected to the plurality of vias, and a second interconnect structure electrically connected to the charger. In some embodiments, a portion of the antenna extends through the insulating layer to electrically connect to the transceiver.

In some embodiments, the semiconductor structure further includes first pillar disposed between the antenna and the transceiver and surrounded by the molding. In some embodiments, the first pillar electrically connects the portion of the antenna and the transceiver. In some embodiments, the semiconductor structure further includes a plurality of second pillars disposed between the charger and the second interconnect structure and surrounded by the molding. In some embodiments, the plurality of second pillars electrically connects the second interconnect structure and the charger. In some embodiments, the RDL further includes a third interconnect structure disposed over the transceiver and electrically connected to the transceiver. In some embodiments, the semiconductor structure further includes a third pillar disposed between the third interconnect structure and the transceiver. In some embodiments, the third pillar electrically connects the third interconnect structure and the transceiver.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a charger configured to convert a charging power from AC to DC;
   a transceiver configured to transmit or receive a signal in a predetermined electromagnetic frequency;
   a molding surrounding the transceiver and the charger;
   a plurality of vias extending through the molding;
   an antenna configured to transmit or receive the signal to/from an ambient environment; and
   a dielectric layer covering the antenna,
   wherein the antenna comprises an elongated portion extending over the molding and a via portion electrically connected to the transceiver.

2. The semiconductor structure of claim 1, wherein the antenna is configured to receive a signal in the predetermined electromagnetic frequency from a transmitter, and the plurality of vias is configured to receive the charging power from the transmitter.

3. The semiconductor structure of claim 1, wherein each of the plurality of vias is a through integrated circuit via (TIV) extending through the molding and inductively coupled with the antenna.

4. The semiconductor structure of claim 1, wherein the antenna has a resonance frequency of about 2.4 GHz.

5. The semiconductor structure of claim 1, wherein the antenna is a Bluetooth antenna.

6. The semiconductor structure of claim 1, wherein the molding has a thickness of about 100 μm and 200 μm.

7. The semiconductor structure of claim 1, further comprising a pillar electrically connecting the via portion of the antenna and the transceiver.

8. The semiconductor structure of claim 7, further comprising an insulating layer disposed over the molding, the plurality of vias and the pillar.

9. The semiconductor structure of claim 8, wherein the via portion of the antenna extends through the insulating layer to contact the pillar.

10. The semiconductor structure of claim 7, wherein the pillar and the antenna comprise a same material.

11. A semiconductor structure comprising:
    a charger;
    a transceiver;
    a molding surrounding the transceiver and the charger;
    a plurality of vias extending through the molding;
    an insulating layer disposed over the molding, the charger, the transceiver and the plurality of vias; and
    a redistribution layer (RDL) disposed over the insulating layer, wherein the RDL comprises:
      an antenna disposed over and electrically connected to the transceiver;
      a first interconnect structure electrically connected to the plurality of vias; and
      a second interconnect structure electrically connected to the charger,
    wherein a portion of the antenna extends through the insulating layer to electrically connect to the transceiver.

12. The semiconductor structure of claim 11, further comprising a first pillar disposed between the antenna and the transceiver and surrounded by the molding, wherein the first pillar electrically connects the portion of the antenna and the transceiver.

13. The semiconductor structure of claim 11, further comprising a plurality of second pillars disposed between the charger and the second interconnect structure and surrounded by the molding, wherein the plurality of second pillars electrically connects the second interconnect structure and the charger.

14. The semiconductor structure of claim 11, wherein the RDL further comprises a third interconnect structure disposed over the transceiver and electrically connected to the transceiver.

15. The semiconductor structure of claim 14, further comprising a third pillar disposed between the third interconnect structure and the transceiver and surrounded by the molding, wherein the third pillar electrically connects the third interconnect structure and the transceiver.

16. A semiconductor structure comprising:
    a charger;
    a transceiver;
    a resonator;
    a molding surrounding the transceiver, the charger and the resonator;
    a plurality of vias extending through the molding;

an insulating layer disposed over the molding, the charger, the transceiver, the resonator and the plurality of vias; and a redistribution layer (RDL) disposed over the insulating layer, wherein the RDL comprises:
   an antenna disposed over and electrically connected to the transceiver;
   a first interconnect structure electrically connected to the plurality of vias; and
   a second interconnect structure electrically connected to the charger,
wherein a portion of the antenna extends through the insulating layer to electrically connect to the transceiver.

17. The semiconductor structure of claim 16, wherein each of the plurality of vias is a through integrated circuit via (TIV) extending through the molding and inductively coupled with the antenna.

18. The semiconductor structure of claim 16, wherein the resonator is electrically connected with the charger and at least one of the plurality of vias.

19. The semiconductor structure of claim 16, further comprising a pillar electrically connecting the via portion of the antenna and the transceiver, wherein the pillar and the antenna comprise a same material.

20. The semiconductor structure of claim 19, wherein the via portion of the antenna extends through the insulating layer to contact the pillar.

\* \* \* \* \*